United States Patent
Shen et al.

(10) Patent No.: US 7,606,063 B2
(45) Date of Patent: Oct. 20, 2009

(54) MAGNETIC MEMORY DEVICE

(75) Inventors: Chih-Ta Shen, Hsinchu (TW); Yung-Hung Wang, Hsinchu (TW); Cheng-Tying Yen, Hsinchu (TW); Kuei-Hung Shen, Hsinchu (TW); Wei-Chuan Chen, Hsinchu (TW); Shan-Yi Yang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/764,624

(22) Filed: Jun. 18, 2007

(65) Prior Publication Data
US 2008/0186758 A1    Aug. 7, 2008

(30) Foreign Application Priority Data
Feb. 7, 2007    (TW) .............................. 96104417 A

(51) Int. Cl.
*G11C 11/00* (2006.01)
*H01L 29/82* (2006.01)
(52) U.S. Cl. ...................................... 365/158; 257/421
(58) Field of Classification Search ................. 365/158; 257/421
See application file for complete search history.

(56) References Cited

U.S. PATENT DOCUMENTS

| | | | |
|---|---|---|---|
| 6,347,049 B1 * | 2/2002 | Childress et al. ............. 365/173 |
| 6,821,907 B2 * | 11/2004 | Hwang et al. ................ 438/709 |
| 7,345,855 B2 * | 3/2008 | Parkin ...................... 360/324.2 |
| 2005/0276099 A1 * | 12/2005 | Horng et al. ................. 365/158 |
| 2005/0280960 A1 * | 12/2005 | Guo et al. ............... 360/327.22 |
| 2006/0093862 A1 * | 5/2006 | Parkin ...................... 428/811.1 |
| 2007/0176251 A1 * | 8/2007 | Oh et al. ...................... 257/421 |
| 2007/0253119 A1 * | 11/2007 | Carey et al. ............. 360/324.11 |
| 2008/0023740 A1 * | 1/2008 | Horng et al. ................. 257/295 |

OTHER PUBLICATIONS

Nagamine, M, etc. Conceptual material Design for Magnetic Tunneling Junction Cap Layer for High magnetoresistance Ratio. Journal of Applied Physics99, 08K703(2006).
Wang, Y.H., etc. Interfacial and Annealing Effects on Magnetic properties of CoFeBthin Films. Journal of Applied Physics99, 08M307(2006).

* cited by examiner

*Primary Examiner*—Evan Pert
(74) *Attorney, Agent, or Firm*—Apex Juris, pllc; Tracy M. Heims

(57) ABSTRACT

A magnetic memory device includes a substrate, a magnetic tunneling junction (MTJ) structure disposed on the substrate, and a capping layer disposed on the MTJ structure. By adding a capping layer on the MTJ structure, the property of the magnetic memory device is improved, the magnetoresistance (MR) ratio is raised, and the time cost by the magnetic memory device to process data is effectively reduced.

6 Claims, 1 Drawing Sheet

MAGNETIC MEMORY DEVICE

CROSS-REFERENCE TO RELATED APPLICATIONS

This non-provisional application claims priority under 35 U.S.C. § 119(a) on Patent Application No(s). 096104417 filed in Taiwan, R.O.C. on Feb. 7, 2007, the entire contents of which are hereby incorporated by reference.

BACKGROUND OF THE INVENTION

1. Field of Invention

The present invention relates to a magnetic memory device, and more particularly to a technology of using a capping layer to improve the property of the magnetic memory device.

2. Related Art

Magnetic random access memory (MRAM) is a new memory device having the advantages of being non-volatile, having high density, high read/write speed, and anti-radiation property. When writing data, a common method employs two current lines, a bit line and a word line, to sense magnetic memory cells selected by the intersection of magnetic fields, so as to change the magnetoresistance (MR) value by changing the magnetization vector direction of a free layer (or referred as a sensing layer). When reading data from the memory, the selected magnetic memory cells are connected to the read current source, so that the digital value of the memory data can be determined from the read resistance value.

Such a magnetic memory cell has a multi-layered stacking structure of magnetic materials, which is formed by stacking an anti-ferromagnetic material layer, a fixing layer formed by ferromagnetic/non-magnetic metal/ferromagnetic materials, a tunneling barrier insulating layer, and a free layer made of ferromagnetic materials. The status of the memory "0" or "1" is determined by a parallel or anti-parallel structure of the magnetization vector of two layers of ferromagnetic materials. However, when the magnetic memory is designed towards the trend of having a high density, the size of the magnetic memory cell must be reduced, resulting in a greater switching field of the free layer, which not only requires a greater current, but also causes a great challenge for the circuit design. Therefore, in designing a magnetic memory device, besides reducing the current, another important task is to achieve the consistency in switching the free layer of all the magnetic memory cells.

Moreover, how to shorten the response time required by the magnetic memory device for processing data and raise the MR ratio of the magnetic device is also an important issue in developing magnetic memory devices. Thus, currently, the MR ratio can be raised in two aspects. One aspect lies in researching and developing the tunneling layer (for example, MgO) of the magnetic device, through which it is found that the MR ratio can be effectively raised to above 200%. Meanwhile, in order to take the magnetic switching property into consideration, the material of the free layer must be changed from CoFeB with a high MR ratio into NiFe magnetic materials with a low magnetostriction coefficient, so as to solve the consistency problem in switching the free layer. However, the MR ratio would be greatly decreased, which is great problem in the design of the magnetic device. The other aspect lies in development of $AlO_x$ tunneling layer device, in which different capping layers are employed to improve the thermal stability and the MR ratio.

SUMMARY OF THE INVENTION

Accordingly, it is an important task in the technology of developing magnetic memory devices on how to improve the property of the magnetic memory device, raise the MR ratio, and effectively reduce the access time by the magnetic memory device in processing data.

The present invention discloses a magnetic memory device, which includes a substrate, a first ferromagnetic layer disposed on the substrate, an insulating layer disposed on the first ferromagnetic layer, a second ferromagnetic layer disposed on the insulating layer, and a capping layer stacked on the second ferromagnetic layer. Herein, stacking the capping layer on the second ferromagnetic layer aims at preventing metal ions in the etching mask from diffusing to the second ferromagnetic layer, so as to prevent the switching property of the magnetic memory device from getting worse. Furthermore, the capping layer can be utilized to effectively raise the MR ratio and maintain a preferred magnetic switching property of the memory device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

A magnetic device is provided through the embodiments of the present invention. In the magnetic device, a capping layer is added to raise the MR ratio of the whole magnetic device, and meanwhile, maintain a preferred magnetic switching motion of the magnetic device.

Figure 1:
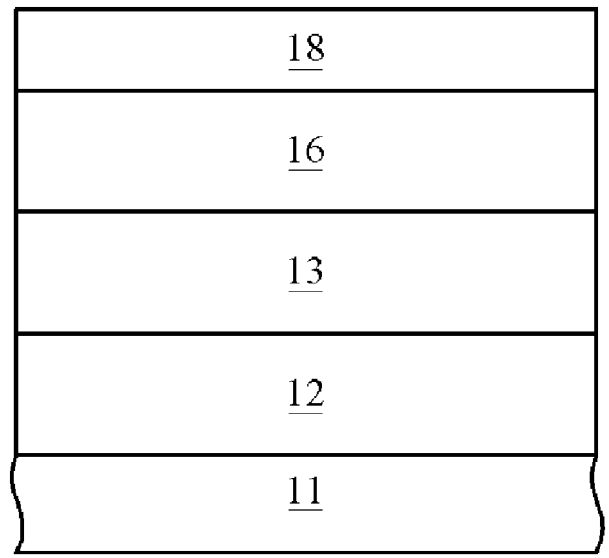
FIG. 1 is a side view of a magnetic memory device according to one embodiment of the present invention.

Referring to FIG. 1, a magnetic memory unit is constituted by a multi-layered magnetic structure, which is generally formed by sequentially stacking three layers: a first ferromagnetic layer 11, an insulating layer 12 or composite ferromagnetic layers, and a second ferromagnetic layer 13. The first ferromagnetic layer 11 is a pinned layer, the insulating layer 12 is a tunneling barrier layer, and the second ferromagnetic layer 13 is a free layer. Memory data is determined by the magnetic moment arrangement status of the first, second ferromagnetic layers 11, 13 respectively the insulating layer 12 is stacked between these ferromagnetic layers. During the etching process of the magnetic memory unit, an adopted etching mask 18 is a metal mask, which is generally made of Ta or TaN. However, during the fabrication process, the Ta ions are easily diffused and result in damaging the second ferromagnetic layer 13. A capping layer 16 is added on the second ferromagnetic layer 13 to prevent the inter-diffusion between the etching mask 18 and the second ferromagnetic layer 13. Furthermore, the capping layer 16 can also be used to adjust the magnetic property of the second ferromagnetic layer (the free layer) 13. Furthermore, in this embodiment, more importantly, it is found that, the capping layer 16 can significantly raise the MR ratio of the whole magnetic memory device, accelerate the data-reading speed, and improve the thermal stability of the device.

Figure 2:
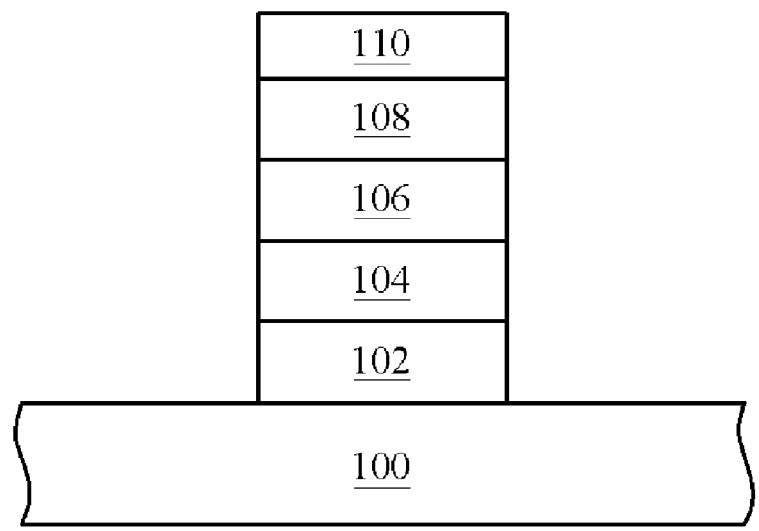
FIG. 2 is a side view of a magnetic memory device according to another embodiment of the present invention.

Next, referring to FIG. 2, it shows a magnetic memory device according to another preferred embodiment of the present invention. The magnetic memory device includes a substrate 100, a first ferromagnetic layer 102, an insulating layer 104, a second ferromagnetic layer 106, a capping layer 108, and an etching mask 110. The first ferromagnetic layer 102 is disposed on the substrate 100, the insulating layer 104 is disposed between the first ferromagnetic layer 102 and the second ferromagnetic layer 106, the capping layer 108 is disposed on the second ferromagnetic layer 106, and the etching mask 110 is disposed on the capping layer 108.

Herein, the first ferromagnetic layer 102 is a pinned layer, the second ferromagnetic layer 106 is a free layer, and the insulating layer 104 is a tunneling barrier layer. Therefore, the first ferromagnetic layer 102, the insulating layer 104, and the second ferromagnetic layer 106 can be sequentially stacked to form a magnetic tunneling junction (MTJ) structure. In this embodiment, the material of the first ferromagnetic layer 102 can be various magnetic materials such as CoFe or CoFeB. The material of the insulating layer 104 can be, but not limited to, $AlO_x$, MgO, or $Fe_3O_4$. The material of the second ferromagnetic layer 106 can be various magnetic materials such as NiFe or CoFeB.

In this embodiment, in order to protect the MTJ structure in the magnetic memory device, a single oxide layer, a single metal layer, or a oxide/metal composite layer serves as the capping layer 108, to prevent the cross-diffusion from occurring between the etching mask 110 on the capping layer 108 and the free layer (second ferromagnetic layer) 106. Herein, the material of the single oxide layer can be MgO, the material of the single metal layer can be Ta or Ru, and the material of the oxide/metal composite layer can be MgO/Mg or Ru/MgO. Herein, the oxide/metal composite layer serving as the capping layer 108 can achieve the most preferred effect. For example, if the material of the insulating layer 104 is $AlO_x$ and the material of the second ferromagnetic layer 106 is NiFe, the MgO or MgO/Mg composite layer serves as the capping layer 108 to improve the magnetic switching property, and to raise the MR ratio of the magnetic memory device from the original 20% to about 30% to 33%.

Furthermore, another advantage of using the MgO/Mg composite layer as the capping layer 108 lies in effectively preventing Ta contained in the etching mask 110 from diffusing under a high temperature, so as to maintain the property of the second ferromagnetic layer (the free layer) 106.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A magnetic device, comprising:
   a substrate;
   a magnetic tunneling junction (MTJ) structure, stacked on the substrate;
   a capping layer, disposed on the MTJ structure, wherein the capping layer is a composite layer, the composite layer is composed of a plurality of material layers, materials of the material layers includes a plurality of different materials, the material layers are an oxide/metal composite layer, and material of the metal oxide/metal composite layer is one selected from a group consisting of MgO/Mg and Ru/MgO; and
   an etching mask, disposed on the capping layer.

2. The magnetic device as claimed in claim 1, wherein the MTJ structure comprises:
   a first ferromagnetic layer;
   a second ferromagnetic layer or composite ferromagnetic layers; and
   an insulating layer, disposed between the first ferromagnetic layer and the second ferromagnetic layer.

3. The magnetic device as claimed in claim 2, wherein material of the insulating layer contains a metal oxide.

4. The magnetic device as claimed in claim 3, wherein the metal oxide is one selected from a group consisting of $AlO_x$, MgO, and $Fe_3O_4$.

5. A magnetic memory device, comprising:
   a substrate;
   a first ferromagnetic layer, disposed on the substrate;
   an insulating layer, disposed on the first ferromagnetic layer;
   a second ferromagnetic layer, disposed on the insulating layer;
   a capping layer, stacked on the second ferromagnetic layer, wherein the capping layer is a composite layer, the composite layer is composed of a plurality of material layers, materials of the material layers includes a plurality of different materials, the material layers are a oxide/metal composite layer, and material of the oxide/metal composite layer is one selected from a group consisting of MgO/Mg and Ru/MgO; and
   an etching mask, disposed on the capping layer.

6. The magnetic memory device as claimed in claim 5, wherein material of the insulating layer is one selected from a group consisting of $AlO_x$, MgO, and $Fe_3O_4$.

* * * * *